(12) United States Patent
Hoshino et al.

(10) Patent No.: US 7,920,911 B2
(45) Date of Patent: Apr. 5, 2011

(54) INTERVENTIONAL MR IMAGING WITH DETECTION AND DISPLAY OF DEVICE POSITION

(75) Inventors: Tsutomu Hoshino, Nagaoka (JP);
Shigehide Kuhara, Otawara (JP);
Hitoshi Yamagata, Otawara (JP);
Yoshimori Kassai, Nasu-Gun (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 752 days.

(21) Appl. No.: 11/208,517

(22) Filed: Aug. 23, 2005

(65) Prior Publication Data
US 2006/0058633 A1 Mar. 16, 2006

Related U.S. Application Data

(62) Division of application No. 09/871,712, filed on Jun. 4, 2001, now Pat. No. 6,961,608.

(30) Foreign Application Priority Data

Jun. 5, 2000 (JP) ................ 2000-167876
Jun. 7, 2000 (JP) ................ 2000-171115

(51) Int. Cl.
*A61B 5/05* (2006.01)
(52) U.S. Cl. ................ 600/423; 600/424
(58) Field of Classification Search ........ 600/411, 600/476, 409, 407, 410, 423–425, 429–435; 324/307, 309
See application file for complete search history.

(56) References Cited

U.S. PATENT DOCUMENTS

| 4,459,990 | A | | 7/1984 | Barnea |
| 5,211,165 | A | | 5/1993 | Dumoulin et al. |
| 5,251,635 | A | | 10/1993 | Dumoulin et al. |
| 5,255,680 | A | | 10/1993 | Darrow et al. |
| 5,265,610 | A | | 11/1993 | Darrow et al. |
| 5,377,678 | A | | 1/1995 | Dumoulin et al. |
| 5,577,502 | A | * | 11/1996 | Darrow et al. ........... 600/426 |
| 5,715,822 | A | | 2/1998 | Watkins et al. |
| 5,730,129 | A | | 3/1998 | Darrow et al. |
| 5,800,354 | A | | 9/1998 | Hofland et al. |
| 5,938,599 | A | | 8/1999 | Rasche et al. |
| 6,122,538 | A | * | 9/2000 | Sliwa et al. ........... 600/407 |
| 6,201,987 | B1 | | 3/2001 | Dumoulin |

(Continued)

FOREIGN PATENT DOCUMENTS

JP 07-255691 10/1995

(Continued)

OTHER PUBLICATIONS

U.S. Appl. No. 09/391,399, filed Aug. 1999, Yamagata.

(Continued)

*Primary Examiner* — Eric F Winakur
*Assistant Examiner* — Lawrence N Laryea
(74) *Attorney, Agent, or Firm* — Nixon & Vanderhye P.C.

(57) ABSTRACT

A magnetic resonance imaging system for interventional MR imaging involves operations to insert a device such as a catheter into an object. According to the system, a tip position of the catheter is detected, data indicative of moved loci of the catheter are produced from data indicative of the detected tip position, and the produced movement locus data are displayed. In addition, even when an operator changes the progress direction of the device such as a puncture needle, an imaging cross-section automatically tracks movements of the device. Appropriate preoperative planning is also provided.

15 Claims, 12 Drawing Sheets

U.S. PATENT DOCUMENTS

| | | | |
|---|---|---|---|
| 6,216,026 B1 * | 4/2001 | Kuhn et al. | 600/409 |
| 6,289,233 B1 * | 9/2001 | Dumoulin et al. | 600/410 |
| 6,470,204 B1 * | 10/2002 | Uzgiris et al. | 600/411 |
| 6,516,213 B1 * | 2/2003 | Nevo | 600/424 |
| 7,027,854 B2 * | 4/2006 | Fuderer et al. | 600/419 |
| 2002/0103430 A1 * | 8/2002 | Hastings et al. | 600/411 |

FOREIGN PATENT DOCUMENTS

| | | |
|---|---|---|
| JP | 8-317915 | 12/1996 |
| JP | 09-122096 | 5/1997 |
| JP | 11-033013 | 2/1999 |
| JP | 2000-225103 | 8/2000 |
| JP | 2000-237164 | 9/2000 |
| JP | 2000-316830 | 11/2000 |

OTHER PUBLICATIONS

Dumoulin et al, "Real-Time Position Monitoring of Invasive Devices Using Magnetic Resonance", MRM 29:411-415 (1993).

* cited by examiner

INTENSITY
HIGH ⟷ LOW
TIME
NEW ⟷ OLD

HUE
RED ⟷ BLUE
TIME
NEW ⟷ OLD

THINNING RATE OF DATA
SMALL ←——→ LARGE
TIME
NEW ←——→ OLD

INTERVENTIONAL MR IMAGING WITH DETECTION AND DISPLAY OF DEVICE POSITION

This application is a divisional of application Ser. No. 09/871,712, filed Jun. 4, 2001 now U.S. Pat. No. 6,961,608, the entire content of which is hereby incorporated by reference in this application.

BACKGROUND OF THE INVENTION

1. Technical Field of the Invention

The present invention relates to a magnetic resonance imaging system capable of performing imaging known as interventional MRI (magnetic resonance imaging).

2. Related Art

Magnetic resonance imaging uses a radio frequency signal of a Larmor frequency to magnetically excite nuclear spins of an object to be imaged placed in a uniform static magnetic field. An MR signal resulting from the excitation is used to reconstruct an image.

Recently, the magnetic resonance imaging has been used in various medical fields. One such use is a treatment or examination to perform paracentesis with a puncture needle inserted from outside the body, operations of a catheter, surgery, and others with magnetic resonance imaging performed or under the state in which the magnetic resonance imaging can be performed. Such magnetic resonance imaging is called as interventional MRI, which has drawn much attention recently.

For the interventional MRI, it is significant that an operator recognizes, accurately and in real time, positions of devices such as a catheter inserted into a patient. Such techniques have currently been under development. It is dispensable for a safe and smooth surgery to accurately inform an operator of positions of the device in real time.

One known technique to detect the positions of the device such as a catheter is magnetic resonance imagining ordinarily for ordinal use. With this technique, the magnetic resonance imaging is performed ordinarily to directly image the position of a catheter to provide an operator with the position. This direct imaging of the catheter can be interpreted, from a physical point of view, as a technique of collecting the influence of the catheter on the magnetic fields as an indirect virtual image and making the operator recognize it on the image.

Another known technique is direct measurement of the position of a catheter. This measurement uses a minute RF reception (detection) coil disposed at the tip of the catheter. In the measurement, RF excitation for imaging is performed to cause an MR signal to be emanated from the vicinity of the RF reception coil. The MR signal is detected with magnetic gradients applied in the three-axis directions, respectively. Then the frequency of the MR signal is obtained, so that the tip position of the catheter is three-dimensionally calculated and displayed.

The measurement that adopts the RF reception coil is for example provided by a paper "1992 SMRM pp. 104, "Tracking of an Invasive Device within an MR imaging system," C. L. Dumoulin, S. P. Souza, and R. D. Darrow."

The measurement written in this paper employs a pulse sequence in which a region to be examined is first entirely excited an RF pulse, then a magnetic gradient in the X-channel is applied to detect an echo signal. The detected echo signal is subject to FFT (Fast Fourier Transform) processing, thus making it possible to calculate a shifted amount from a resonance frequency of a peak value in the frequency spectrum. Based on both the shifted amount and the intensity of the magnetic gradient, positional information in relation to the RF detection coil (the tip of the catheter) in the X-direction is calculated. Then, for each of the Y-channel and Z-channel, like the above, the RF excitation is carried out, a magnetic gradient is applied in the channel, and positional information abut the RF detection coil is calculated in each channel. Therefore, pieces of the three-dimensional positional information indicating the catheter tip can be obtained.

Further, another direct measurement that uses the RF reception coil is known, wherein a plurality of RF reception coils are disposed on a catheter in order to grasp and display an entire position of the catheter.

The interventional MRI involves, by way of example, a needling operation during which a device such as a puncture needle is gradually inserted into the body toward a target such as a tumor. Such an operation requires confirmation of needled states, i.e., whether or not the needle advances along a planned direction and/or whether or not the needle reaches a target.

To confirm those needled states, a conventional technique acquires sectional images each containing both of a needling start position obtained before paracentesis and a target. That is, during the needling operation, sections containing both the target and the puncture needle are imaged in sequence and used for monitoring needling states with reference to a reference section that has been imaged before the needling.

However, the foregoing conventional techniques have encountered various difficulties as follows.

First, there are problems concerning positional detection of a device such as a catheter.

A first problem is as follows. Since the positional detection according to the conventional ordinary imaging is based on the technique of imaging indirectly influence of a device on a magnetic field, it was difficult to provide an operator with an accurate position of the device tip. This is because the contour, positional shifts and/or intensity of the device on images are changed depending on imaging techniques; position, direction and material of a catheter; and imaging directions. Further, because a pulse sequence for imaging is used to recognize a device position, recognizing the position at a time instant always requires a period of time needed for one time of ordinary imaging. This results in a problem that resolution to display the position of the device tip is still lower.

A second problem derives from the conventional technique of attaching an RF reception coil on the tip of a device such as a catheter. In this technique, only one point (spot-like substance) indicating a coil position is depicted on images. This technique was unfavorable to the observation of the entire device. It was also difficult to grasp a direction along which the device is currently oriented and a direction along which the device should be needled from now on. Additionally, in this case, a slight spatial deviation of the catheter tip, which occurs due to hand shaking, makes it difficult to precisely recognize the tip spatial position.

A third problem relates to the technique of attaching a plurality of RF reception coils on the device. In this configuration, it is necessary to perform the positional detection for each of the plural RF reception coils. This makes the entire system complicated and it takes time to measure the positions of the coils.

Second, there are problems concerning monitoring needled states of a device such as a catheter.

A first drawback is concerned with a reference section (that is, an imaged section containing both a needling start position and a target) acquired before starting the paracentesis. The reference section is frequently shifted due to breathing and body motions of a patient. Such shifts become obstacles to a smooth needling along a scheduled path, requiring a great deal of time and work in the needling operation. This may cause trouble in treatment and examination.

A second drawback will be caused when an operator inserts a puncture needle in a direction different from the reference section. If such an insertion is done, the needle tip deviates from the reference section, thus failing to display the tip on images. Hence the conventional monitoring technique was not suitable for needling operations involving subtle operations.

A third problem arises due to an interval between a preoperative plan and an actual treatment. Normally, prior to the paracentesis, a needling plan (preoperative plan) that includes planning both of a start position for needling and a path for needling is done based on a reference image acquired beforehand. However, the planned position and path are obtained only on an image, but the planned ones differ in feeling from actual positions on the body surface of a patient to be needled. Hence, in performing the actual paracentesis, it takes much time for an operator to understand positional relationships about the needling start position and needling path based on the plan. This results in a lowered patient's throughput and frequently generates the situation where needling results in different ones from the planned needling start position and planned path.

SUMMARY OF THE INVENTION

An object of the present invention is to, with due consideration of the above conventional problems, improve the positional detection and presentation of a device, the confirmation of needled states of the device, and a preoperative plan in the interventional MRI.

A practical first object of the present invention is to allow the position of a device such as a catheter to be detected with accuracy and in a shorter period of time, while still maintaining a relatively simplified configuration, thereby providing an easier understanding of the position, direction, and progress direction of the entire device.

A practical second object of the present invention is to prevent a reference cross section from deviating from both a needling start position and a target due to breathing and body-motions of an object.

A practical third object of the present invention is to enables a steady monitoring of motions of the tip of a puncture needle and an easier performance of sensitive needling operations, even when the progress direction of the puncture needle is about to deviate from the direction of the reference cross section owing to body motions of a patient and/or an operator's operation to change the progress direction of the puncture needle.

A practical fourth object of the present invention is to permit a target to be needled and a needling start position and path to be grasped with easiness.

To realize the first object, according to one embodiment of the present invention, there is a magnetic resonance imaging system for interventional MRI involving an operation of a device to be inserted into an object, the system comprising detection means for detecting a position of a tip of the device; and movement state display means for displaying a movement state of the tip of the device on the basis of positional data of the tip detected by the detection means.

This configuration makes it possible that, for example, positional data of the tip of a device such as a catheter, which were acquired in the past, are re-displayed on the screen depending on the time instant at which the positional data were acquired. The entire image as well as the tip position of the device are displayed easily and almost in real time.

Further, to realize the foregoing second and third objects, another embodiment of the present invention provides a magnetic resonance imaging system used for interventional MRI involving operations a device to be inserted into an object and for obtaining an image of a section from an MR signal acquired through application of magnetic fields on a predetermined pulse sequence on the object, the system comprising positional detection means for detecting positional information of the device; and control means for controlling imaging parameters included in the pulse sequence on the basis of the positional information detected by the positional detection means so that the section always contains the device.

This configuration enables the imaged cross section to automatically trace motions of the device in such a manner that at least a predetermined part of the device is contained in the imaged cross section at any time, even if an object body moves or an operator changes the directions of the device such as a puncture needle. Because the device is always displayed, the device is not lost on the image, thus making it possible to perform sensitive device operations.

Furthermore, another example of the present invention provides a magnetic resonance imaging system used for interventional MRI involving operations a device to be inserted into an object and for obtaining an image of a section from an MR signal acquired through application of magnetic fields on a predetermined pulse sequence on the object, the system comprising preoperative plan means for planning operations of the device by using the image before the operations; and output means for outputting a plan about planned by the preoperative plan means in association with the object.

Thus, information indicative of a paracentesis plan such as a needling start position is actually indicated on the body surface of an object. This indication is performed by for example a light projector that projects light onto the body surface of an object. This enables an operator to easily confirm necessary items for paracentesis, such as a target to be needled, a needling start position, and a needling path, by viewing the projected information on the object's body surface to be handled actually, thus enabling the operator to understand it well.

According to the present invention, an operation (interventional MRI) can be performed under the guidance of MR imaging on the basis of a preoperative plan established as above. In response to necessity, or, at any time, MR imaging can be performed during the operation. In the case of an operation on MR imaging, compared to an operation on X-CT imaging, there are advantages that there is no worry about X-ray exposure and imaging can be done timely on the spot to confirm operational progress states and an object's lesion. In the case of the interventional MRI, differently from the X-CT, functional information as well as ordinal contour information can be acquired during the operation, with the result that functions or others of an organ can be confirmed on the spot.

DETAILED DESCRIPTION OF PREFERRED EMBODIMENTS

Referring to the accompanying drawings, a variety of preferred embodiments according to the present invention will now be described.

First Embodiment

Referring to FIGS. 1 to 4, a first embodiment of the present invention will now be described.

A magnetic resonance imaging system according to the present embodiment is constructed as, what we call, an open type of system. This open type of system provides an easier access to an object, which is therefore suitable for interventional MRI.

Figure 1:
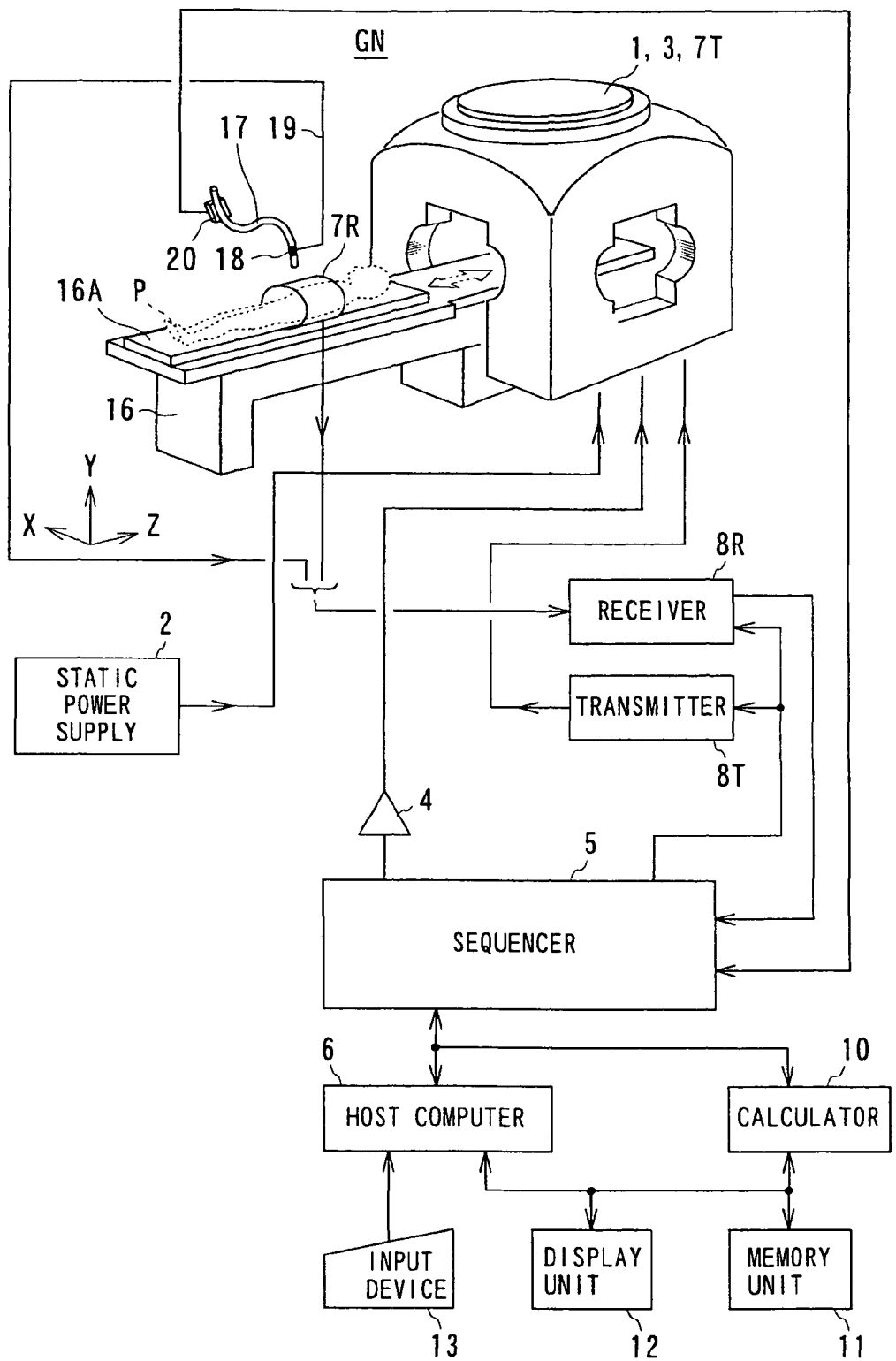
FIG. 1 is a block diagram outlining the configuration of an open type of magnetic resonance imaging system according to a first embodiment of the present invention.

An outlined configuration of this magnetic resonance imaging system is shown in FIG. 1. The magnetic resonance imaging system is equipped with an open type of gantry GN in which a patient handles as the object is placed within a static magnetic field. This gantry GN has a magnet 1 for the static magnetic field, which is constructed by laterally arranged magnets such as superconducting magnets, and four pillars for support the magnets. The static magnet 1 has two pairs of disc-like magnets, each pair being placed in an upper or lower structure thereof, thus providing a diagnostic spacing between the upper and lower structures. A static magnetic field having a uniform-strength imaging region is generated in the diagnostic spacing by driving a static power supply 2. A patient (object) laid on a tabletop 16A of a couch 16 is inserted into the diagnostic spacing.

On a wall of the diagnostic spacing of the magnet 1, gradient coils 3 and a transmission RF coil 7T are disposed. A reception RF coil 7R is disposed at a position nearer to a region to be diagnosed of the object P on the tabletop 16A. The RF coil attached on the wall of the diagnostic spacing of the magnet 1 may serve as both transmission and reception of RF signals.

The gradient coils 3 includes x-, y- and z-coils (not shown) to generate slicing, phase-encoding, and reading gradient pulses superposed on the static magnetic field on the basis of a given pulse sequence. A gradient amplifier 4 receives control signals to control X-, Y- and Z-axis directional gradients from a sequencer (sequence controller) 5 in order to control application of pulsed currents to be supplied to the x-, y- and z-coils. The X-, Y- and Z-axes are physical axes designated to the gantry GN. The control of the pulsed currents permits the slicing, phase-encoding and reading gradients to be controlled.

The transmission and reception RF coils 7T and 7R are electrically connected to a transmitter 8T and a receiver 8R, respectively. Both of the transmitter 8T and receiver 8R are also electrically coupled with the sequencer 5. The transmitter 8T accepts a control signal that the sequencer 5 gives, and responsively sends out a transmission current pulse to the transmission RF coil 7T. Thus, an RF magnetic pulse is generated from the RF transmission coil 7T, and applied to for example the whole body of the patient including a region to be diagnosed.

An MR signal yielding from the patient in response to the applied RE magnetic pulse will be received by the reception RF coil 7R, then sent to the receiver 8R as RF current. The receiver 8R makes the received RF current undergo predetermined reception processing, such as amplification, detection and digitization, thus MR data converted into digital amounts being sent to a calculator 10 by way of the sequencer 5.

The sequencer 5 is provided with a CPU and memories and controls the drive of both the gradient amplifier 5 and the transmitter 8T on the basis of pulse sequence information given by the host computer 6 when scanning is performed.

The host computer 6 is provided with a CPU and memories and is responsible for various types of execution that include control of drive timing of the whole system and scanning control for imaging. The host computer 6 is electrically coupled with a storing unit 11, display unit 12 and input device 13. The host computer 6 executes scanning control by calculating information indicative of a pulse sequence to provide the calculated information to the sequencer 5.

The calculator 10, which is electrically coupled with both the host computer 6 and the sequencer 5, has the capability of performing both of reconstruction of images and processing to display moved loci of a later-described catheter. For reconstruction, the calculator 10 takes in received MR data via the sequencer 5, maps those data in a two- or three-dimensional k-space (also referred to as a Fourier space or frequency space), and performs two- or three-dimensional Fourier transform with the mapped data into real-space image data. The calculator 10 also executes the processing to display moved loci of a catheter. That is, the calculator 10 receives MR data via the sequencer 5, then performs the display an entire image of the catheter based on those data.

On the other hand, the gantry GN of the magnetic resonance imaging system is formed into an open type, as described above, so that the system is convenient for interventional MRI. The present embodiment will now be described about, as the interventional MRI, an embodiment in which a catheter 17 is inserted into the object P to perform necessary treatments.

On the tip of the catheter 17, a minute RF detection coil 18 is secured. The RF detection coil 18 serves as a reception coil to the transmission RF coil 7T. A received signal by the RF detection coil 18 is sent to the receiver 8R through a thin cable 19.

On a handle portion of the catheter 17, an input unit 20 for marking data of time instants is attached. When an operator operates the input unit 20, an operation signal is sent from the input unit 20 to the calculator 10 via the sequencer 5.

The catheter 17 will now be described as a representative of interventional devices, so the interventional device may be for example a puncture needle, guide wire, or electric end scope.

Figure 2:
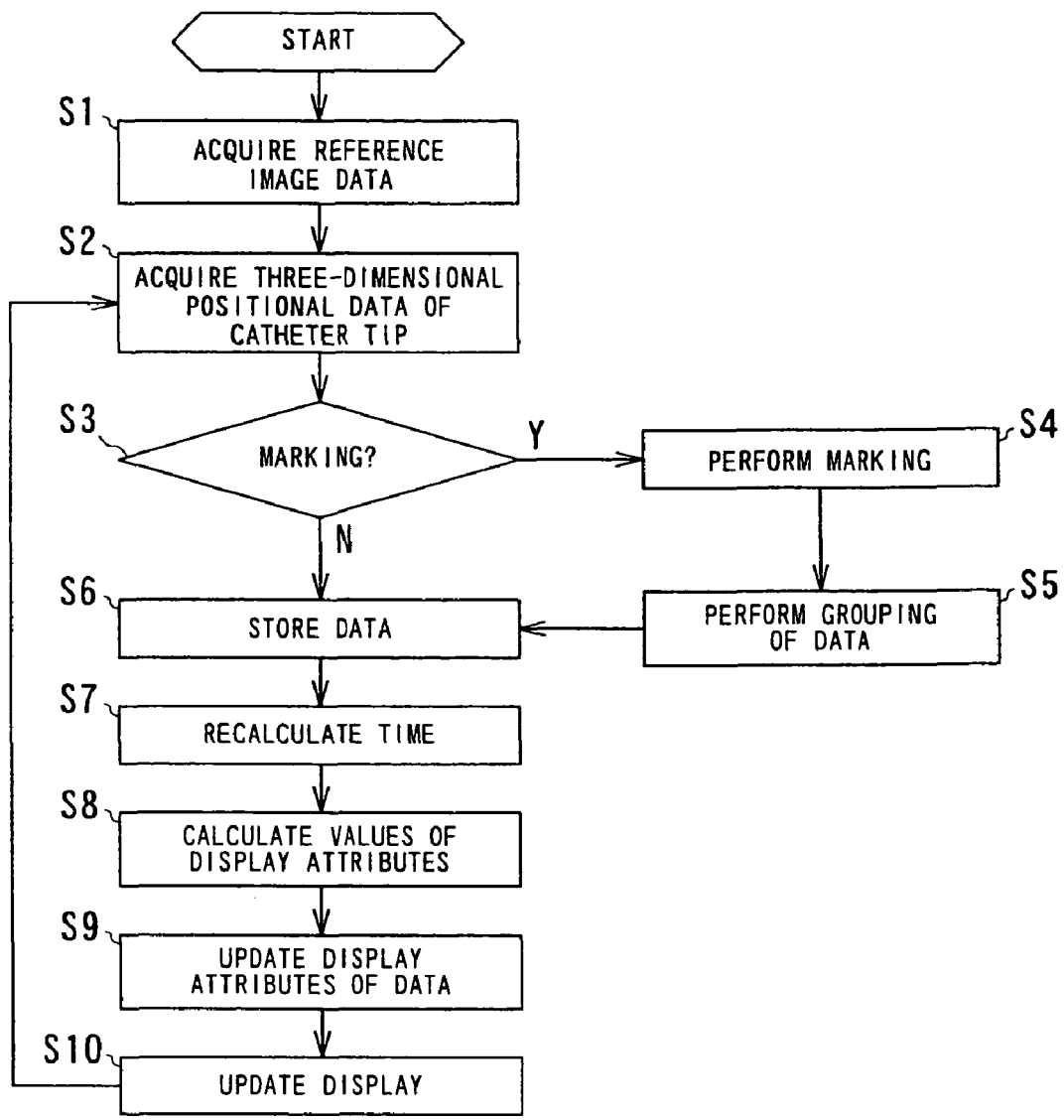
FIG. 2 is a flowchart outlining locus display processing of the tip of a catheter.

Next, the operations of the magnetic resonance imaging system will now be described based on FIG. 2 mainly showing display processing of loci to indicate movements of the catheter 17, which is cooperatively executed by the host computer 6, sequencer 5, and calculator 10.

Under the control of the host computer 6, ordinary MR imaging, that is, imaging that uses the transmission and reception RF coil 7T and 7R is carried out to obtain a reference image to display positions of the catheter 17 (step S1).

Figure 4:
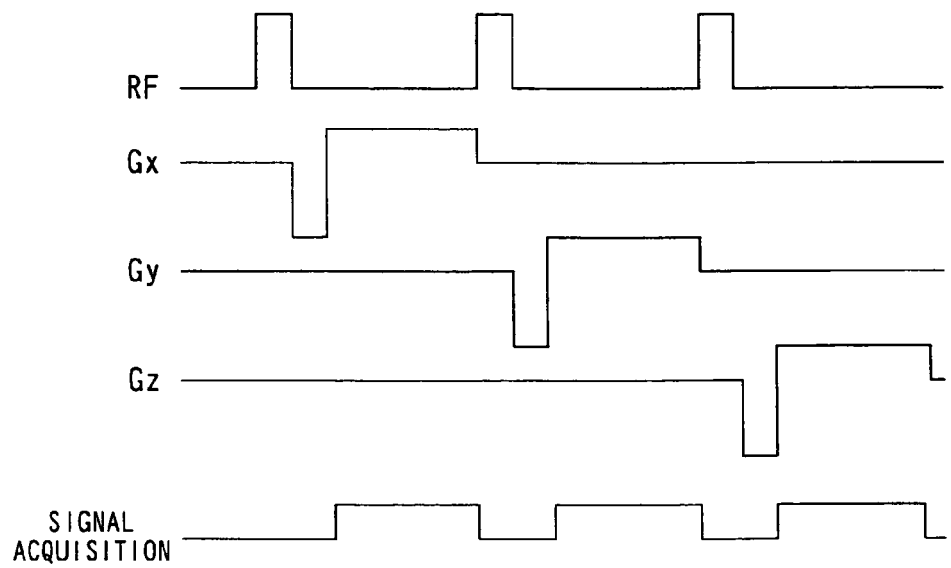
FIG. 4 outlines a pulse sequence used for detecting the position of the catheter tip.

Then, under the control of the host computer 6, three-dimensional positional data indicating positions of the tip of the catheter 17 are detected with the help of the sequencer 5 and calculator 10 (step S2). This three-dimensional positional detection is carried out, as shown in FIG. 4, for each of the X-, Y- and Z-channels, by performing RF excitation, application of a gradient pulse (generation of a gradient echo), acquisition of an echo signal, Fourier transform of the echo signal (calculation of a shifted amount from a resonance frequency), and conversion into positional data in each axial direction (step S2).

Then, the calculator 10 determines whether or not time instant data should be marked by detecting an operational signal to be sent from the input unit 20 attached on the handle portion of the catheter 17 (step S3). When the determination is YES, the current time instant data are marked with a flag, for instance (step S4). This marking processing is executed every time the operator arbitrarily operates the input unit 20. That is, with observing a catheter-displaying monitor screen on the display unit 12, the operator operates the input unit 20 at appropriate timing.

Then the calculator 10 defines three-dimensional positional data indicating the tip of the catheter 17, which are acquired sequentially in time between the last marking and this time of marking, as one group of data (grouping) (step S5).

After this groping, the calculator 10 stores the grouped three-dimensional positional data into the storing unit 11 (step S6). In cases where there is provided no operational signal to mark data at step S3 (NO at step S3), the acquired three-dimensional positional data are stored into the storing unit 11 (step S6).

Further, the calculator 10 updates time instant data (recalculation of the time instant) (step S7), calculates a value to attributes (such as intensity and/or color) of data to be displayed (step S8), and updates the attributes of the data to be displayed (step S9).

This update is executed to not only change the display states of the positional data group by group, thereby making the position of the tip of the catheter 17 noticeable, but also display the entire image of the catheter 17. For instance, intensity (brightness) inversely proportional to a period of time from the acquisition of the positional data to the display thereof is calculated, before intensity data are assigned to each group of the positional data. Through this processing, the highest intensity is assigned to the newest group of positional data, while the second highest intensity is assigned to the second newest group of positional data. In other words, the older the acquired time instant, the less the intensity of positional data group by group.

When the three-dimensional positional data that indicate the position of the tip of the catheter 17 have been prepared as described above, the positional data are displayed on a reference image in a superimposed manner (step S10) After this, the processing is returned to step S2 to detect the position of the catheter tip. Hereafter, the foregoing positional detection and display are repeatedly performed.

Figure 3:
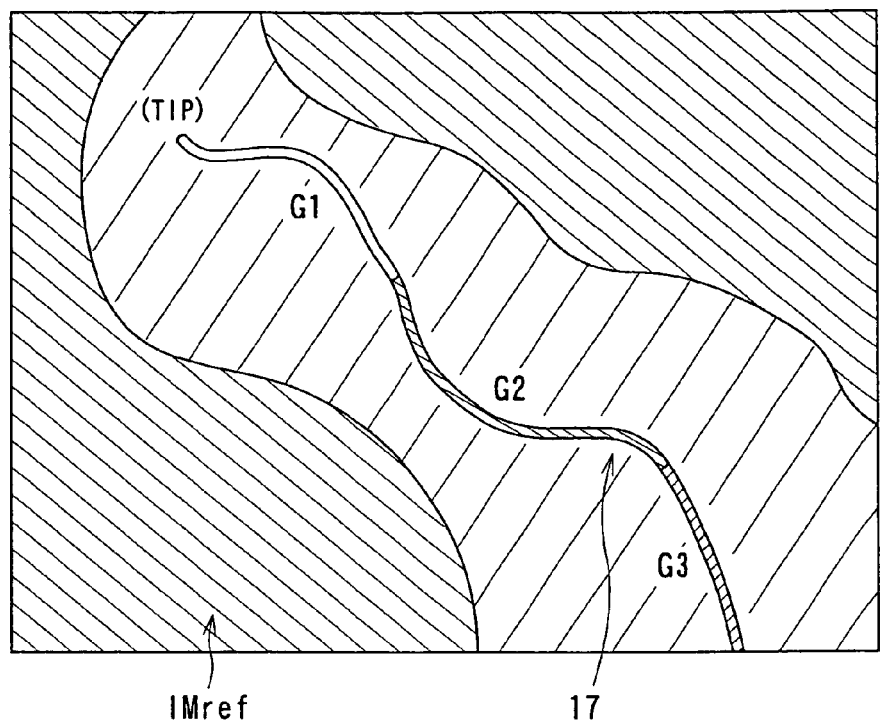
FIG. 3 shows a monitor screen according to one example of the locus display of the catheter tip.

The foregoing repetition makes it possible to represent a catheter image exemplified in FIG. 3 on the display unit 12 as a monitor image. On the background consisting of the reference image $IM_{ref}$, the loci of movements of the catheter 17 is displayed in a superposition mode. The loci of the catheter 17 is depicted as a group of positional data acquired by the detection processing of tip positions (step S2 in FIG. 2) executed regularly at every minute interval. This locus image is composed of grouped images (G1, G2, and G3) produced at appropriate timings responding to each operation signal coming from the input unit 20 operated by the operator. The display mode differs group by group. In this embodiment, the locus of the sequentially newest group G1 is displayed by the highest intensity (brightness), that of the second newest group G2 is displayed by the second highest intensity, and that of the oldest group G3 is displayed by the lowest intensity.

This way of imaging provides an easier understanding of the entire image of the catheter 17, in addition to the tip positions thereof.

Further, instead of or additionally to the above intensity control, the grouped positional data by the time marking in the foregoing embodiment can undergo processing of non-display, re-display, newly adjusting the intensity, adjusting hues, and/or correcting the positions. Such processing for display allows an operator to observe the tip positions of catheter and the entire image thereof in a steady manner, even when the operator brings back or advances more deeply the catheter. Furthermore, in place of the intensity adjustment, both of hues and intensity can be changed in performing the grouping display based on the marking.

The foregoing embodiment has displayed the positional data grouped by the temporal marking, but the grouping is not absolutely necessitated. For example, positional data indicative of the tip of a catheter are continuously detected to memorize them sequentially in time, as described before, and the memorized positional data are modulated in a given display mode using the newest time instant as a criterion. This way also enables the display of loci of the catheter tip.

Figure 5:
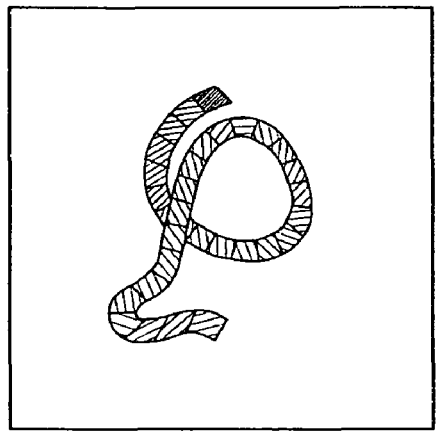
FIG. 5 pictorially shows one example of locus display of the catheter tip.
Figure 6:
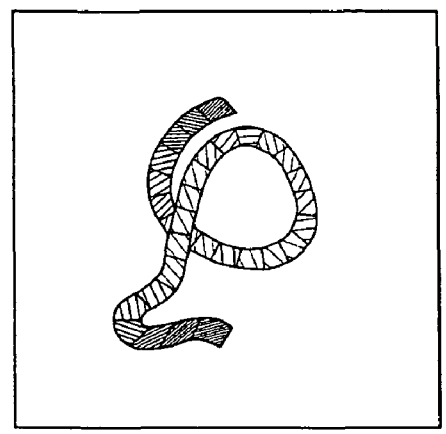
FIG. 6 pictorially shows another example of locus display of the catheter tip.
Figure 7:
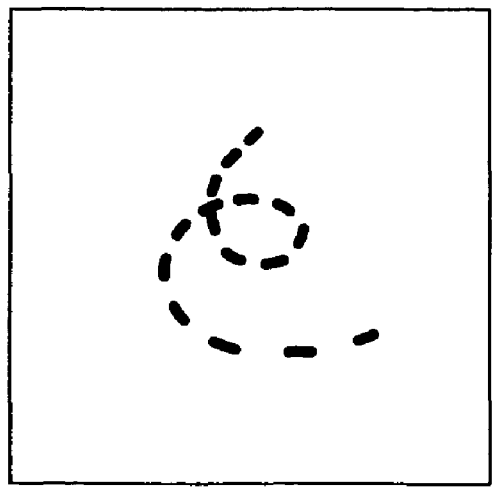
FIG. 7 pictorially shows another example of locus display of the catheter tip.

Display examples are shown in FIGS. 5 to 7. FIG. 5 exemplifies the display of loci of a catheter tip, of which intensity is modulated on time instants. In this display example, the positional data currently detected (at the newest time instant) are modulated into the highest intensity (brightness), whilst all positional data detected at time instants older than that are modulated into a degree of intensity slightly lower than the highest one. Incidentally, of the positional data detected at those older time instants, intensity may be decreased gradually in proportion to the lapses in the past.

FIG. 6 exemplifies the display of loci of a catheter tip modulated into various hues proportionally to time instants. In this display example, the positional data detected at the present time (the newest time instant) are modulated into a predetermined hue (for instance, red), while all positional data which have been detected in the past are modulated into another hue (for instance, blue). In this case, even the positional data detected in the past can be modulated in a series of hues changing from red to blue, little by little, in proportion to the lapses in the past.

Furthermore, FIG. 7 exemplifies the display in which the loci of a catheter tip are depicted by a dotted line, which can be obtained by thinning some of the positional data. In this display example, the thinning rate for the positional data becomes larger as the detected time instant traces back. Hence, as getting nearer to the current tip position, the density of dots along the dotted line becomes dense, providing a more distinctive locus representation.

In the processing for the display shown in FIGS. 5 to 7, in cases where the direction along which the catheter advances is calculated by subtraction between positional data detected at different times and the calculated direction shows the trace back of the catheter, the display before the return can be deleted or changed in display modes.

For the display shown in FIGS. 5 to 7, the intensity, hues, or thinning rate of positional data can be changed according to time instants. Such changes make the current position of a catheter tip differentiate distinctly from the past tip positions and provides the locus information indicative of the tip positions that have been existed so far.

Thus, the display mode has not been the same from the past to the present, so that the current position of the tip of a catheter can easily be distinguished from the past positions. This leads to simplified and more accurate operations of the catheter. During the operations of a catheter, it is frequent that the tip of the catheter is moved at a certain position right and left and back and forth, little by little. Further, it is also frequent that the tip of a catheter moves shakily responsively to hand's shakings. If such a situation occurs and the current and past tip positions of the catheter are overlapped one on another, an operator is able to recognize, with quickness and precise, what display position represents the current catheter tip.

As a configuration for detecting a tip position of the catheter, a plurality of minute RF detection coils can be secured on the tip. Another detecting configuration can be provided through image processing to obtain the tip position from pixel values of MR images acquired by the ordinary MR imaging. In this image processing, a preferred position-detecting sensor is provided by a marker member attached on the tip and that contains substance (such as water, PVA or oil) qualified as an NMR signal source.

In addition, the magnetic resonance imaging system according to the present invention may be constructed into a cylindrical type of gantry.

Second Embodiment

Figure 8:
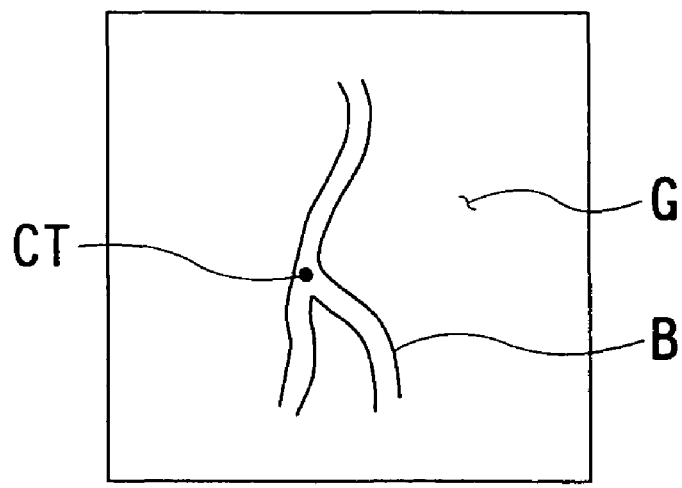
FIG. 8 pictorially shows one example of locus display of the tip of a catheter, which involves a reference image, according to a second embodiment of the present invention.

Referring to FIG. 8, a second embodiment will now be described. The magnetic resonance imaging system used by this present embodiment is also applied to the interventional MRI. The constituents of this system are identical or similar to those in the first embodiment, so the same references are adopted to omit their detailed explanations.

The processing executed by the present embodiment is concerned with tracking of a catheter, i.e., a representative of various devices, that has been inserted into an object.

As described in the foregoing first embodiment, when the tip of the catheter under operations is tracked with use of a minute Rr detection coil (micro coil), only a small area (spot like area) obtained by processing signals acquired from the RF detection coil is depicted as tracking loci. However, the depiction of such a small area is unsatisfactory for a full understanding of positional relationships between the catheter tip and surrounding tissue and/or blood vessels. In such a case, it is difficult for an operator to decide at which position or in which way the catheter should be placed or advance as the next operation.

In the present embodiment, the host computer 6, sequencer 5, calculator 10, storing unit 11, and display unit 12 perform the following processing in a mutually cooperative manner. At first, a preparing operation is carried out such that an MR image (for example, coronal image) of a cross section (slice) that contains a path along which a catheter will be operated is acquired and preserved as a reference image. Then the interventional MRI is carried out, during which the detected positional data of the tip of a catheter by using the foregoing manner are read and displayed on the reference image in a superposition manner.

FIG. 8 shows one display example, wherein a reference G represents a reference image containing a blood vessel B and a reference CT represents the tip of a catheter.

This display enables an operator to easily comprehend the positional relationships between the catheter tip CT and the surrounding tissue and blood vessels, leading to more precise catheter operations. For instance, the running direction of a blood vessel can be used as a guide to operate the catheter. It was very difficult to obtain such effective positional relationships from only signals detected by the minute RF detection coil.

Incidentally, in the reference-image-based display method of the position of tip of a catheter, the reference image may be updated intermittently (one time per second, for example) to display it. When such display is done, both of the sequencer 5 and the calculator 10 are driven to perform interrupt-based imaging processing of the reference image during the detection of the position of the catheter tip. Hence, for instance, pieces of positional information indicative of the catheter tip are updated at 20 frames per second, while still updating the reference image (for example, coronal image) at a rate of one time per second. Even if a patient moves when the catheter is actually operated or under operations, the surrounding tissue depicted on the reference image is automatically and regularly updated into surrounding tissue that has existed at a new location to which the catheter is moved.

Further, in the updated display of the reference image, it is desirable that a section to be used for the update is imaged based on the technique of what is called tracking of a cross section. Specifically, signals from a minute RF detection coil are used, as stated above, to calculate the position (x, y, z) of the RF detection coil (that is, the catheter tip position) and to set imaging parameters based on a known technique so that an updated section always contains the position (x, y, z). This allows the catheter tip position to be tracked almost in real time, with the result that the reference image on the display screen is updated by images each containing the catheter tip at any time. Therefore, the situation that the catheter tip disappears from the reference image on the screen can be avoided, more improved easiness and accuracy of operations of a device being provided.

The reference image usable in the second embodiment is not always limited to the coronal image, but axial or sagittal images can be used. In addition, as the reference image, it is also possible that either of an arbitrary selected oblique surface that contains both a target and a catheter tip or another arbitrary selected oblique surface that contains both a target and a catheter path is displayed.

Further, the number of cross sections to be imaged as the reference image is not limited to one section. Although the rate of image updates is lowered in proportion to the number of imaging sections, two sections consisting of one section that contains both of a catheter tip and a target and the other section perpendicular to this section may be set. Alternatively, mutually orthogonal three sections each containing a catheter tip may be designated.

Third Embodiment

Figure 9:
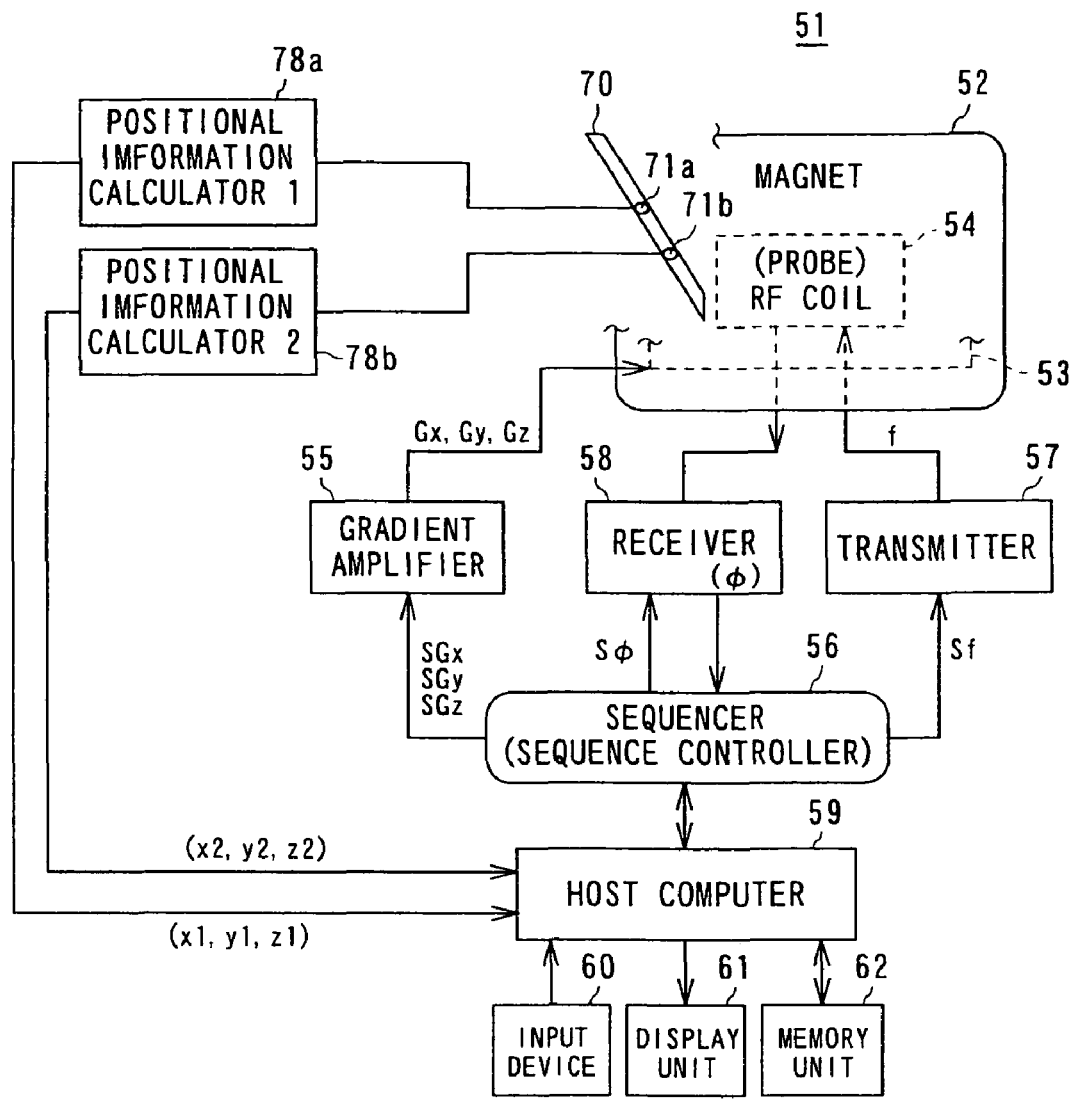
FIG. 9 is a block diagram outlining the configuration of a magnetic resonance imaging system according to a third embodiment of the present invention.
Figure 10:
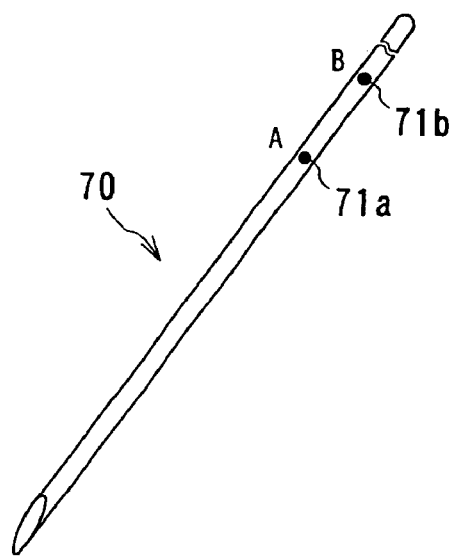
FIG. 10 is a view showing the position of a positional sensor attached on a puncture needle.

Referring to FIGS. 9 to 10, a third embodiment will now be described.

The magnetic resonance imaging system according to the present embodiment is directed to the interventional MRI capable of automatically tracking a cross section to be imaged to a puncture needle serving as a device.

An outlined configuration of the magnetic resonance imaging (MRI) system is shown in FIG. 9.

The magnetic resonance imaging system has a gantry 51 for generating a static magnetic field in which a patient as the object is placed. The gantry 51 includes a static field magnet 52 composed of for example a superconducting magnet. A diagnostic region of which magnetic intensity is uniform is in part formed of the static field generated by the magnet 52. For the magnet 52 formed in an approximately cylinder, a patient is located partly and entirely within the diagnostic region with the patient laid on a not-shown couch. In the case that the magnet 52 is an open type, a patient is located partly and entirely within the diagnostic region with the patient sitting and standing up.

Gradient coils 53 are mounted on a wall of the magnet 52, and an imaging RF coil 54 is disposed in an inner spacing of the magnet 52. The gradient coils 53 are composed of x-, y- and z-coils to generate magnetic field gradient pulses in slicing, phase-encoding and reading directions in response to a given pulse sequence, which are superimposed on the static field. The unit of the gradient coils 53 is electrically connected to a gradient amplifier 55. The gradient amplifier 55 receives, from a sequencer 56, control signals SGx, SGy and SGz to control gradient fields in X-, Y- and Z-axes (physical axes assigned to the gantry 52). Those control signals are used to control application of pulsed currents to be supplied to the x-, y- and z-coils. This allows slicing, phase-encoding, and reading magnetic gradients to be controlled.

The RF coil 54 is constructed to serve both of transmission and reception coils, for instance, and connected with a transmitter 57 and a receiver 58 both connected to the sequencer 56 as well. The transmitter 57 receives a control signal Sf coming from the sequencer to responsively send a transmission current pulse to the RF coil 54. This pulse causes the RF coil 54 to generate an RE magnetic pulse applied to a diagnostic region of a patient (for example, the head). For two-dimensional imaging, in parallel to the application of the RF magnetic pulse, a slicing gradient is applied, resulting in that a desired slice of the diagnostic region is selectively excited to generate an MR signal from the slice owing to a magnetic resonance phenomenon.

The thus-generated MR signal is detected by the RF coil 54, before being sent to the receiver 58 in the form of a corresponding RF current signal. In the receiver 58, the received RF current signal is subjected to predetermined reception processing including amplification, detection, and digitization, thereby digital amounts of MR data being provided to the host computer 57 via the sequencer 54.

The sequencer 56 has a CPU and memories and controls and, based on pulse sequence information given from the host computer 57, controls the control signals SGx, SGy, SGz and Sf to be sent to both the gradient amplifier 55 and the transmitter 57 during the scanning. Using pieces of information given by the host computer 59, the sequencer 56 causes the gradient amplifier 55 to adjust X-, Y- and Z-axial magnetic gradients Gx, Gy and Gz by amounts of $\Delta$Gx, $\Delta$Gy and $\Delta$Gz, respectively, causes the transmitter 57 to adjust the frequency f of the transmission RF signal by an amount of $\Delta$f, and causes the receiver 58 to adjust a reference phase $\phi$ for phase detection within the receiver 58 by an amount of $\Delta\phi$ in response a control signal S$\phi$.

The host computer 59 is provided with a CPU and memories and in responsible for timing control for driving the entire system, scanning control for imaging, image reconstructing processing, tracking control of an imaging section to a device such as a puncture needle. A dedicated processor may perform the image reconstructing. The host computer 59 is connected to an input device 60, display unit 61 and storing unit 62. The host computer 59 calculates pulse sequence information for scanning control and sends it to the sequencer 56. In addition, the image reconstructing processing is done such that received MR data map a two- or three-dimensional k-space (Fourier space or frequency space), then the mapped data undergo two- or three-dimensional Fourier transform to reconstruct the MR data into real-space image data.

Units to enable an imaging section to automatically track to the puncture needle, which are illustrated in FIG. 9, will now be described.

A puncture needle 70 is used to perform treatment such as paracentesis or examination on a patient P inserted or laid in the diagnostic spacing of the static magnetic field 52. The puncture needle 70 has a thin needle body made from a rigid material. At two specified positions on the needle body, positional sensors 71a and 71b are placed respectively to detect the position of the needle body.

By way of example, each of the positional sensors 71a and 71b consists of a passive element or active element composed of a minute RF detection coil (micro coil), magnetic sensor, or optical sensor. During the operation of paracentesis (that is, during imaging), each sensor generates a magnetic or optical positional signal or generates a magnetic or optical positional signal to yield an electric signal.

Further, as another positional sensor, a reception element into which an NMR signal source (such as water, PVA, or oil) and a minute RF detection coil is united may be used. When using that reception element, magnetic spins in the NMR signal source are excited by an RF signal, thus an MR signal being generated to be detected as a pulsed current (positional detection signal) by the RF detection coil. Though the sensitivity region of the RF detection coil itself is very narrowly set, the NMR signal source is always placed within the sensitivity region. Therefore, compared to the conventional technique that uses only the minute RF detection, a remarkably greater-intensity positional signal can be detected. In addition, such a united sensor allows the sensitivity region of the RF detection coil to still remain narrowly, providing a higher degree of positional detectability.

Positional detection signals coming from the positional sensors 71a and 71b are sent to positional information calculators 78a and 78b, respectively. Each of the positional sensors 71a and 71b is equipped with, by way of example, a dedicated CPU to perform one-dimensional Fourier transform on inputted positional signals in the X-, Y- and Z-axial directions. This gives spatial positional information in relation to the needle body, that is, the puncture needle 70. The pieces of positional information are sent to the host computer 59 and used for processing to automatically track a region to be imaged.

The host computer 59 calculates a spatial position of a cross section containing the puncture needle 70 on the basis of the positional information at the two points on the puncture needle 70. This enables the calculation of positions of the cross section always containing the puncture needle, whenever the puncture needle is to shift from the cross section. Additionally, the host computer 59 is in charge of adjusting imaging parameters (imaging conditions) to be sent to the gradient amplifier 55, transmitter 57, and receiver 58, according to the calculated positions of a cross section to be imaged. The imaging parameters include the carrier frequency of an RF excitation pulse, magnetic gradient components in the X-, Y- and Z-axes, and the frequency and phase of a reference signal for reception phase detection.

The adjustment of the imaging parameters is carried out with the technique of repeatedly imaging and displaying the same cross section at a higher speed, that is, called fluoroscopic imaging. Thus, scan control can be performed to automatically track the puncture needle 70 and the spatial position of the puncture needle 70 can always be monitored.

In this automatic tracking of an imaged cross section, the used positional sensors are two in number, so one more piece of positional information is necessary to determine a spatial position of the image cross section. However, in the present embodiment, the host computer 59 performs the display of three mutually orthogonal sections each containing the two points at which the positional sensors 71a and 71b exist, or selects at least one of the three sections to display it on the display unit 61.

Accordingly, under the performance of the conventional MRI, even if a cross section to be imaged is relatively shifted within the body of a patient under treatment due to the patient's motions or an operator changes the puncture needle in any direction at the operator's will, the puncture needle is always on a monitor image of the cross section. This way allows paracentesis requiring sensitive needling operations to be done easily and steadily.

In addition, the foregoing positional sensors and their attachments can be developed in other modifications.

Figure 11:
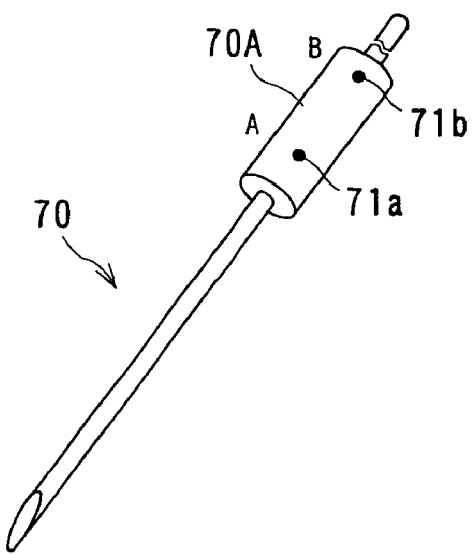
FIG. 11 is another view showing the position of a positional sensor attached on a puncture needle.

For example, as shown in FIG. 11, it is not necessarily true that the positional sensors are on the needle body. According to this configuration shown in FIG. 11, the puncture needle 70 has a handle portion 70A to give an operator an easier grip and to be secured to the needle body in a certain positional relationship. On the handle portion, the two positional sensors 71a and 71b are attached.

Figure 12:
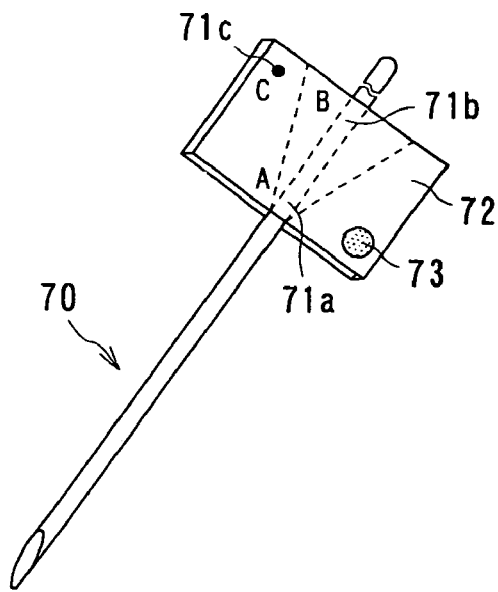
FIG. 12 is another view showing the position of a positional sensor attached on a puncture needle.

In the case of the attachment shown in FIG. 12, a support portion 72 is secured to the puncture needle 70 so that the puncture needle 70 can be freely moved within a certain range along a two-dimensional surface. On the support portion 72 is securely provided the positional sensors. In the configuration of FIG. 12, the two positional sensors 71a and 71b are attached on the needle body, while one more positional sensor 71c is attached on the support portion 72, thus providing a sensing structure of three sensors. Accordingly, in addition to the two points A and B at which the two positional sensors 71a and 71b, positional information obtained from one more point C at which the positional sensor 71c is attached on the support portion 72 can be taken into account. It is therefore possible that a section that contains the support portion 72 can be imaged, instead of three mutually orthogonal sections. This permits an operator to move the puncture needle 70 in a more sensitive manner. As stated in this example, the positional sensors may be secured on the needle body, handle portion, and/or support portion solely or a combined fashion.

Incidentally, on the support portion 72 exemplified in FIG. 12, a commanding device 73 consisting of a push button 73 is securely placed. This commanding device 73 is used by an operator to send commands of the start, stop and other operations of fluoroscopic imaging to the magnetic resonance imaging system. Hence, while performing needling operations, the operator is able to issue commands for MR scanning necessary for the fluoroscopic imaging. The commanding device 73 may be replaced by a foot switch or voice controller.

Figure 13:
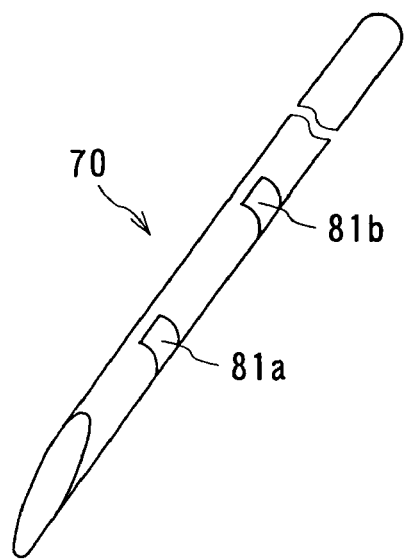
FIG. 13 is another view showing the position of a positional sensor attached on a puncture needle.
Figure 14:
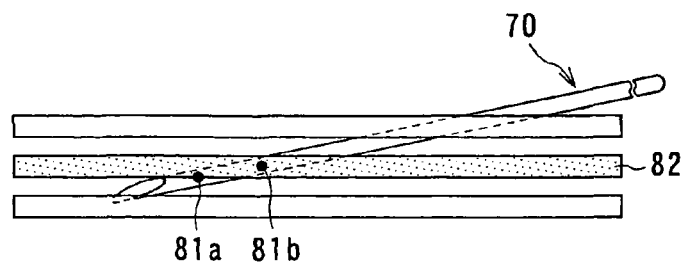
FIG. 14 is another view showing the position of a positional sensor attached on a puncture needle.

Further, it is not always necessary that the positional sensor be composed of an active element to output a positional signal by itself. As an example, as shown in FIG. 13, two or more markers 81 (81a and 81b) each containing substance qualified as an NMR signal source may be attached to the needle body of the puncture needle 70, like the above. In such a case, a section that contains both of a target such as cancer and a needling start position is determined in advance (refer to a center section 82 shown in FIG. 14). Then, as observing an acquired section image, an operator controls by hand the position of the needle so that at least two markers 81a and 81b are always included in the section 82. As shown in FIG. 14, a plurality of slices may be obtained by multislice imaging.

Fourth Embodiment

Figure 15:
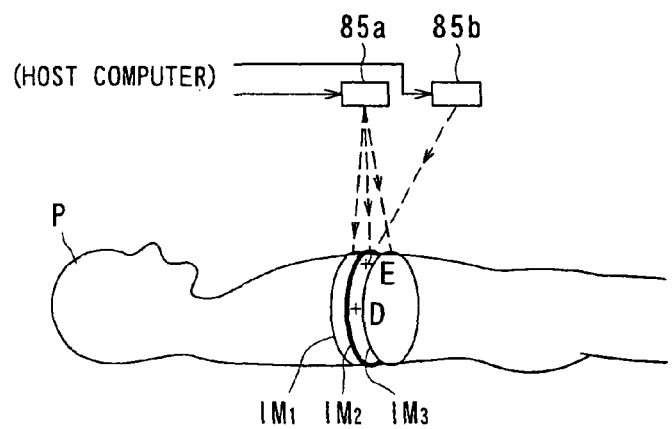
FIG. 15 illustrates a configuration to directly indicate needling plan information such as needling start position onto a patient's body surface, which is performed by a magnetic resonance imaging system according to the fourth embodiment of the present invention.
Figure 16:
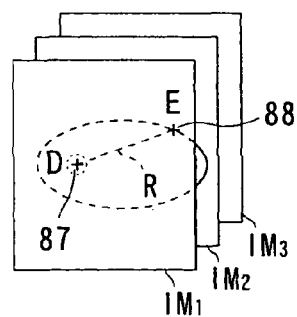
FIG. 16 pictorially showing images to be displayed when a needling plan is performed.

Referring to FIGS. 15 to 16, a magnetic resonance imaging system according to a fourth embodiment of the present invention will now be described. The same or similar constituents as or to those in the third embodiment are given to the same references and their detailed explanations are omitted or simplified.

The magnetic resonance imaging system has the function of producing a preoperative plan to make an operator grasp spatial positional relationships between a target such as cancer and a needling start position in an easier manner.

The entire configuration of this magnetic resonance imaging system is almost the same as that previously described, but different in that, as shown in FIG. 15, the system is additionally equipped with light projectors 85a and 85b to automatically projecting light in response to control signals given from the host computer 59. Each of the light projectors 85a and 85b consists of a laser apparatus, for example. The light projectors are preferred to an open type of magnet, in which they are secured on the ceiling of the magnet.

With this magnetic resonance imaging system, as shown in FIGS. 16 and 17, the preoperative plan is made before an actual operation. The preoperative plan in paracentesis uses a plurality of images $IM_1$ to $IM_3$, which have been previously imaged, to determine the position of a target such as cancer, a needling path, and a needling start position. In this embodiment, the preoperative plan is made by the host computer 59 that has the capability of reading a certain program previously stored in the storing unit 62 and executing the program step by step. Thus, with the input device 60 and the display unit 61 used, an operator is able to interactively establish the preoperative plan.

FIG. 16 exemplifies this planning, in which three tomographic images $IM_1$ to $IM_3$ of an object P have been acquired in advance. Suppose that the central image $IM_2$ contains a target such as cancer.

The display processing carried out by the host computer 59 allows the display unit 61 to represent the three tomographic images $IM_1$ to $IM_3$ in a scrolled manner or divided display manner. An operator is to observe the three tomographic images $IM_1$ to $IM_3$ by displaying those images in for example the descent order through operations of the input device 13. When finding a target D present in the central image $IM_2$, the operator handles the input device 60 to specify the image $IM_2$. Information thus specified is sent to from the input device 60 to the host computer 59.

The host computer 59 uses the information specifying the tomographic image $IM_2$ so as to calculate the position of one 85a of the two light projectors 85a and 85b, a control signal indicative of a calculated position being sent to the one light projector 85a. Thus, as shown in FIG. 15, the light projector 85a projects light showing the slice position and range of each tomographic image directly onto the body surface of the object P. The positions of the plural tomographic images $IM_1$ to $IM_3$ which are now in use are indicated in the body axis direction on the body surface.

As shown in FIG. 15, the central topographic image $IM_2$ selected by the operator on the screen is projected in an enhanced fashion of its sliced portion. Therefore, the operator is able to easily recognize that the target D is contained in the enhanced slice.

Then, the topographic image $IM_2$ containing the target D is represented on the display unit 61. In response, as shown in FIG. 16, the operator handles the input device 13 to mark a target point 87 on the target D with a cursor or others, and determines a desired needling path R. When the needling path R has been decided, a needling start position E can be designated. Hence the operator again marks another target point 88 at the designated needling start position.

Based on the determined needling plan information, the host computer 59 issues a control signal toward the other light projector 85b. Thus, the light projector 85b projects a mark indicative of the needling start position E on the body surface (refer to FIG. 15).

The operator starts needling at the light-marked needling start position E on the body surface, and switches over the imaging mode to the fluoroscopic mode (continuous imaging). By this switching, the tomographic image $IM_2$ of the central slice is displayed as a reference image. Thus, as observing this reference image, the operator is able to make the puncture needle advance to the target D.

As stated, the needling plan information is directly projected as optical information onto the body surface of the object P, which is noticeably different from needling work based on plan information realized simply on the monitor screen. That is, the necessary needling start position and needling direction can be directly given the operator. It is therefore possible that the operator is able to grasp the needling start and operations under needling in a shorter and more accurate manner, thus allowing a more precise and speedy needling work.

As a modification, it is preferred that the planned needling path R is superimposedly displayed on the reference image. The operator can observe both of the needling start position E and the needling path R, and understand those well.

The forth embodiment can be practiced in a variety of further modifications, which are given below.

For example, for the imaging previously performed for making the needling plan, positions to be imaged may be designated with the foregoing light projectors 85a and 85b directly projecting light on the object P. In this configuration, positions to be light-projected by the light projectors can be changed by commanding devices, such as a touch panel type of sub console or foot switch, which should be usable in the shield room in which the magnetic resonance imaging system is installed. Additionally, a handy type of light projector is allowable, capable of easily adjusting a light-projected position by hand can be adopted as the foregoing light projectors.

Further, the foregoing embodiment has adopted the configuration in which the needling path is designated along the same single section, but the designation of the needling path is allowed to be spread over plural sections (slices).

Figure 17A:
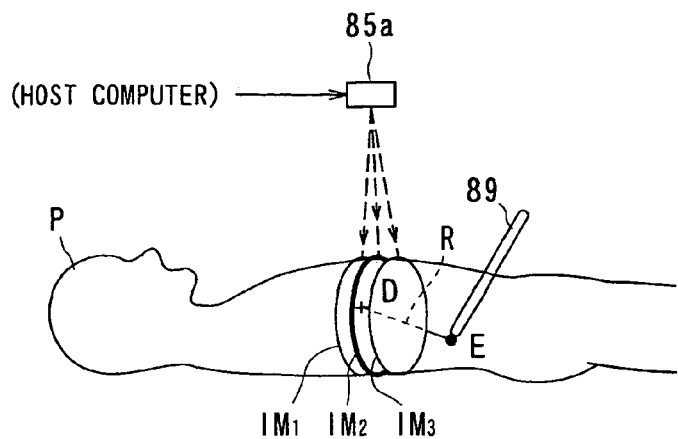
FIG. 17A is a pictorial illustration for explaining a modification of the configuration to indicate a needling start position.
Figure 17B:
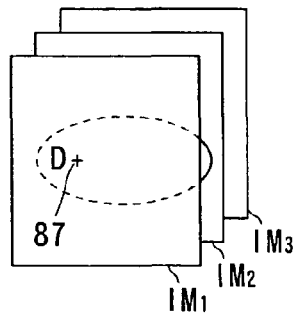
FIG. 17B shows images for explaining a modification of the configuration to indicate a needling start position.

As shown in FIGS. 17(a) and 17(b), a pointing device 89 may be used to directly specify the needling start position E on the object's body. In such a configuration, it is enough that positional information indicative of the tip of the pointing device 89 can be detected by means of a magnetic sensor or optical sensor. For example, the puncture needle that has been described in the third embodiment is used, in which the positions of the two positional sensors and the distances to the needle body tip are previously measured. This configuration eliminates the necessity of using another pointing device, but allows the tip of the puncture needle to determine the needling position in a direct manner. The fluoroscopic imaging and display for monitoring the puncture needle are performed based on a section that contains both of the marker 87 and the needling start position E designated on the image. This way makes the needling work easier.

Figure 18:
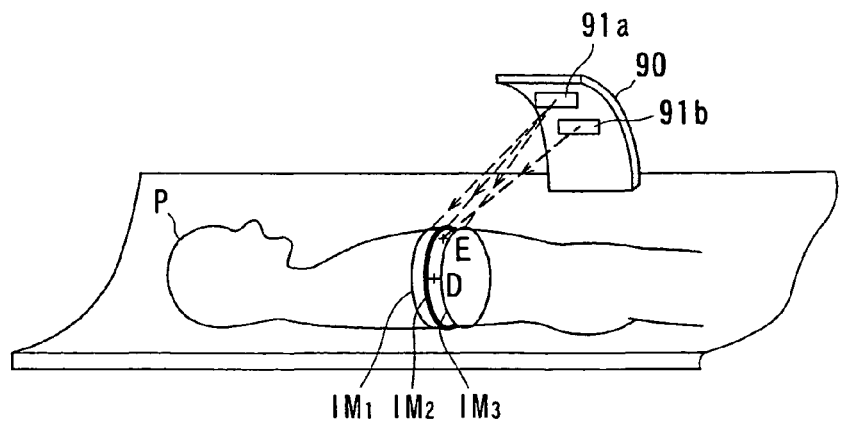
FIG. 18 illustrates another embodiment to show attachment of a light projector.

Another modification is provided in FIG. 18, wherein an attachment member 90 is secured on the couch. This attachment member 90 is used to directly indicate needling plan information on the object's body. The foregoing light projectors 91a and 91b can be secured on the attachment member 90. Alternatively, the light projectors may by replaced by a mechanical commanding needle or a needling guide hole through which the puncture needle passes, provided that such a device is capable of indicating a needling start position and needle inserting direction.

Fifth Embodiment

Figure 19:
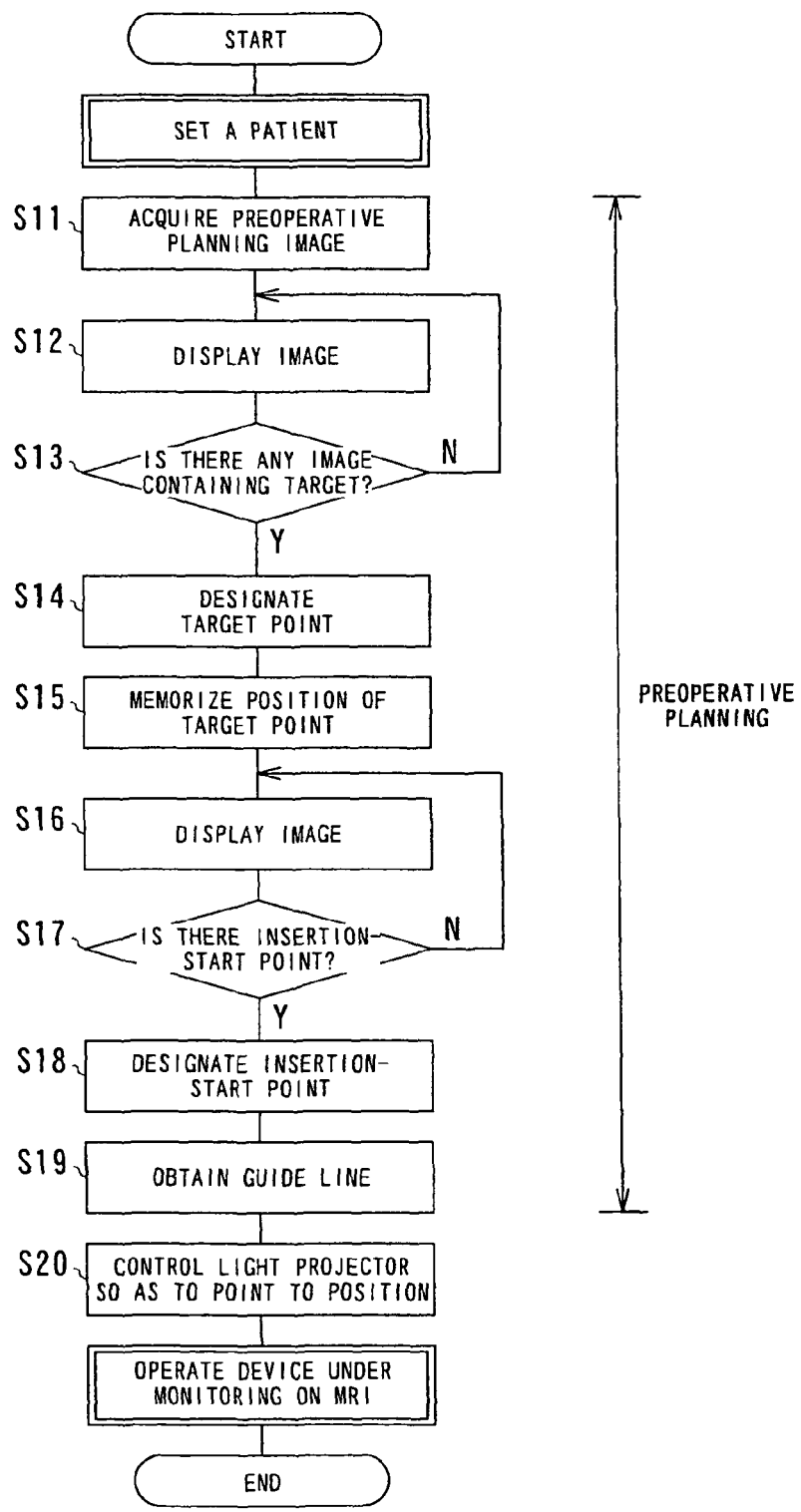
FIG. 19 is a flowchart outlining a preoperative plan performed by a magnetic resonance imaging system according to a fifth embodiment of the present invention.
Figure 20:
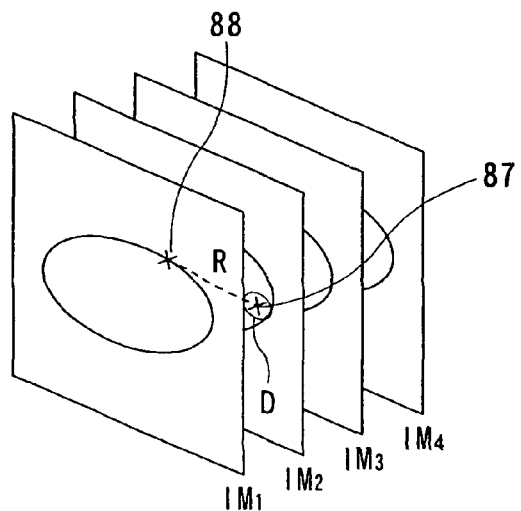
FIG. 20 is a pictorial illustration of the preoperative plan by the fifth embodiment.

Referring to FIGS. 19 and 20, a magnetic resonance imaging system of a fifth embodiment according to the present invention will now be described.

Like the fourth embodiment, this magnetic resonance imaging system is characteristic of another preoperative plan for the interventional MRI.

The host computer 59 executes a previously stored program so that a preoperative plan is established in an interactive manner via the input device 60 and display unit 61. The processing for the preoperative plan is exemplified in FIG. 19.

For establishing the preoperative plan, a patient as the object is placed inside the gantry 51 with the patient laid on the couch, then a region that contains a target such as cancer or constriction is imaged on the multislice technique (step S11 in FIG. 19). Thus, images for the preoperative plan are acquired. After this imaging, with the patient still kept on the couch continuously from the last MR imaging, the processing proceeds to the preparative planning.

Suppose that the preoperative plan is for paracentesis. First of all, the host computer 59 executes display processing in an interactive manner, so that the multi-sliced images that have been acquired in advance are displayed in turn on a liquid-crystal monitor placed within the shield room (step S12). Then the operator finds, from the displayed plural images, an image that contains a target (step S13). When finding such an image, the operator operates the input device 60 to send an operation signal to the host computer 59 so as to specify the target on the image by a point or others (step S14). Responsively to this specification, the host computer 59 records the position of the targeted point (step S15).

Then, in response to the operator's specification, the host computer 59 causes the previously imaged images of the multislices to be displayed respectively in turn on the liquid crystal monitor (step S16). With observing each image, the operator engages in searching an appropriate slice (cross section) that has a position suitable for the designation of an insertion start position of the puncture needle (step S17) When such a slice is found, the operator operates the input device 60 to cause the host computer 59 to specify the insertion start point for the puncture needle on the image with a pointer (step S18).

On determining both the two points consisting of the targeted point and the insertion start point, the host computer 59 calculates a straight line that connects the determined two points within a space formed by the three-dimensional image data (multi-sliced image data) (step S19). This straight line provides a guideline indicating a needling path along which the puncture needle should advance.

One such guideline R is pictorially illustrated in FIG. 20. In this illustration, a reference D depicts a target, a reference 87 depicts a targeted point, and a reference 88 depicts an insertion start point, respectively. The present preoperative plan allows the targeted point 87 and the insertion start point 88 to be specified separately from each other on the slices, providing a higher degree of freedom in specifying the guideline R.

In addition, in cases where a catheter is used as the device and an object to be operated with the catheter is a blood vessel, MRA (MR angiography) images that have been imaged previously are used to obtain, as the guide line, a curved line in compliance with the running of the blood vessel.

As described above, the patient setting is followed by performance of the preoperative plan. That is, the host computer 59 drives one or both of the light projectors 85a and 85b such that the insertion start point 88 is at least projected by an optical beam onto the body surface of the patient P. Thus, the insertion start point is specified at least (step S20). In place of the light projector, a projector can be used.

Preferably, the insertion start point of the puncture needle 70 is subject to highlighted display or changed hue display so that it is easier to visually distinguish the point from the other light-specified positions. Alternatively, together with the specification of the insertion start point, either of the light projectors 85a and 85b may be dedicated to the highlighted display of a cross section that contains the targeted point. Thus, inserting the puncture needle 70 can easily be started.

Then, the operator engages in device operations (in this case, the needling operations) under the MR imaging.

In the device operations, signals informing an initially inserted angle state of the puncture needle 70 at the insertion start point may be issued with physical mediums such as sound or light.

Figure 21:
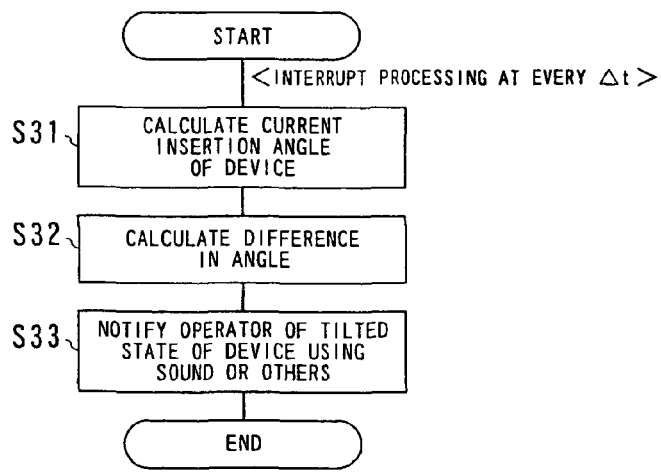
FIG. 21 outlines a flowchart of processing to assist the designation of an initial insertion angle of a device inserted by an operator.

This issuing can be done by the host computer 59, of which outlined processing is exemplified in FIG. 21. Practically, the host computer 59 receives positional information (x1, y1, z1) and (x2, y2, z2) about the puncture needle 70, which are outputted from the positional information calculators 78a and 78b, and calculates a current angle (insertion angle) of the needle 70 from the received positional information (step S31). Then information about the guideline calculated in the preoperative plan is read to perform subtraction between an initially inserted angle of the guideline and the current angle of the puncture needle 70 (step S32). Then the host computer 59 issues a drive signal to a not-shown alarm (such as a speaker or an LED), the drive signal being produced in such a manner that the smaller the difference, the larger the intensity of an issued physical medium (step S33).

As a result, in the device operations, as the initially inserted angle of the device at the insertion start point gets nearer to a predetermined angle of the guideline, sound or light given an operator becomes larger in intensity or brightness. An alternative way is that, as an actual insertion start angle comes closer to an angle shown by the guideline, tunes can be changed. Since the sound or light assists the initial insertion (i.e., needling) of the device, an operator is able to insert or guide the device into the object's body with more precision along the guideline predetermined by the preoperative plan.

Further, in the device operations under the MR imaging, visual devices (such as a head mounted display (HMD), which is composed of liquid crystal glasses) may be associated with the processing of the host computer 59. For example, in the case of the liquid crystal glasses, one display (for example, a glass for the left eye) is formed into a clear lens so that an operator is able to directly observe an object (patient), while the other display (a glass for the right eye) is formed to display an image (MR image) showing an operating path, the image being supplied from the host computer 59. An operator who wears this liquid crystal glasses to operate a device is able to mutually synthesize in the brain both of a real image reflected from the patient' body surface and a fluoroscopic image acquired from inside the patient. This gives a helpful and effective assist to the operator, even during the insertion of the device.

When using the liquid crystal glasses, both of the displays can be composed of supplying MR images each showing an operating path, thus providing a stereoscopic display. If fast switching over both the liquid crystal displays between both of the clear mode and the image display mode provides overlapped images of an actual reflected image from the object' surface (real image) and a computed image (MR image) showing an operation path, thus greatly helping operator's device operations.

Figure 22:
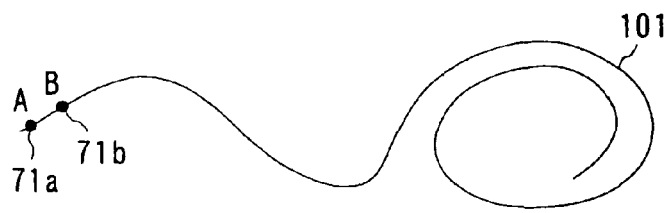
FIG. 22 is an illustration showing an attached state of a positional sensor on a catheter serving as a device for treatment and examination.

Moreover, the third to fifth embodiments have been explained about the puncture needle serving as the treating and examining device dedicated to the interventional MRI, but such device is not always limited to the puncture needle. As shown in FIG. 22, the device may be a catheter 101. Securing the positional sensors 71a and 71b to the catheter 101 is able to provide the similar operations and advantages to those explained before.

The third to fifth embodiments can be practiced to a magnetic resonance imaging system of which gantry is formed into either a cylindrical or an open type.

As described, one mode of the foregoing magnetic resonance imaging system is constructed such that the position of tip of the device is detected, movement locus data of the device are produced from the detected positional data, and the produced data are displayed. In addition to the tip position of the device such as a catheter, the position and direction of the whole device are provided to an operator in almost real time with the system sill simplified. Hence, device operations in examination and treatment according to the interventional MRI can greatly be facilitated and done with more precision.

Another mode of the foregoing magnetic resonance imaging system is directed to the interventional MRI, in which even if an object moves or an operator changes directions along which the devise such as a puncture needle, a cross section to be imaged always tracks motions of the devise in an automatic fashion. In consequence, the imaged cross section that always contains the device is provided, facilitating the operations such as needling work, which requires sensitive movements.

Further, information established by a needling plan is actually projected and commanded on the body surface of an object, so that an operator is able to intuitively recognize a needling start position, the position of a target to be needled and others, compared to the technique of making reference to only an image on the display. This contributes to more accurate and smooth operations for examination and treatment.

What is claimed is:

1. A magnetic resonance imaging system for interventional MRI involving an operator's operation to insert a catheter into an object, the catheter having a tip and being inserted into the object from the tip thereof, comprising:
   scanning means for magnetically scanning a region of the object to acquire image data of the region;
   detection means for detecting positional information indicative of a position of the tip of the catheter within the object;
   tracking means for automatically tracking an imaging section which changes according to a motion of the catheter when a traveling direction of the catheter is changed; and
   display means for displaying both of an image based on the acquired image data of the region and, together with the image, a movement state of the tip of the catheter based on the detected positional information;
   wherein the display means is configured to display, in a superimposition manner, the positional information of the position of the tip on the image serving as a reference image, and to display the imaging section which tracks the motion of the catheter when the traveling direction of the catheter is changed.

2. The magnetic resonance imaging system according to claim 1, wherein the display means is configured to display the movement state of the tip of the catheter, together with time information indicative of elapse during detecting the positional information.

3. A magnetic resonance imaging system for interventional MRI involving an operator's operation to insert a catheter into an object, the catheter having a tip and being inserted into the object from the tip thereof, comprising:
   scanning means for magnetically scanning a region of the object to acquire image data of the region;
   an RF detection coil attached on the tip of the catheter;
   means for acquiring, together with application of a gradient magnetic field to the RF detection coil, an MR signal from a vicinity of the RF detection coil excited by an RF magnetic field;
   means for obtaining positional information indicative of a position of the RF detection coil as the position of the tip of the catheter through a frequency analysis of the MR signal;
   tracking means for automatically tracking an imaging section which changes according to a motion of the catheter when a traveling direction of the catheter is changed; and
   display means for displaying both of an image based on the acquired image data of the region and, together with the image, a movement state of the tip of the catheter based on the detected positional information;
   wherein the display means is configured to display, in a superimposition manner, the positional information of the position of the tip on the image serving as a reference image, and to display the imaging section which tracks the motion of the catheter when the traveling direction of the catheter is changed.

4. The magnetic resonance imaging system according to claim 3, wherein the RF detection coil is one in number.

5. The magnetic resonance imaging system according to claim 3, wherein the display means is configured to display the movement state of the tip of the catheter, together with time information indicative of elapse during detecting the positional information.

6. A magnetic resonance imaging system for interventional MRI involving an operator's operation to insert a catheter into an object, the catheter having a tip and being inserted into the object from the tip thereof, comprising:
   a scanning unit configured to magnetically scan a region of the object to acquire image data of the region;
   a detection unit configured to detect positional information indicative of a position of the tip of the catheter within the object;
   a computer system configured to automatically track an imaging section which changes according to a motion of the catheter when a traveling direction of the catheter is changed; and
   a display unit configured to display both of an image based on the acquired image data of the region and, together with the image, a movement state of the tip of the catheter based on the detected positional information;
   wherein the display unit is configured to display, in a superimposition manner, the positional information of the position of the tip on the image serving as a reference image, and to display the imaging section which tracks the motion of the catheter when the traveling direction of the catheter is changed.

7. The magnetic resonance imaging system according to claim 6, wherein the display unit is configured to display the movement state of the tip of the catheter, together with time information indicative of elapse during detecting the positional information.

8. A magnetic resonance imaging system for interventional MRI involving an operator's operation to insert a catheter into an object, the catheter having a tip and being inserted into the object from the tip thereof, comprising:
   a scanning unit configured to magnetically scan a region of the object to acquire image data of the region;
   an RF detection coil attached on the tip of the catheter;
   an acquiring unit configured to acquire, together with application of a gradient magnetic field to the RF detection coil, an MR signal from a vicinity of the RF detection coil excited by an RF magnetic field;
   an obtaining unit configured to obtain positional information indicative of a position of the RF detection coil as the position of the tip of the catheter through a frequency analysis of the MR signal;
   a computer system configured to automatically track an imaging section which changes according to a motion of the catheter when a traveling direction of the catheter is changed; and
   a display unit configured to display both of an image based on the acquired image data of the region and, together with the image, a movement state of the tip of the catheter based on the detected positional information;
   wherein the display unit is configured to display, in a superimposition manner, the positional information of the position of the tip on the image serving as a reference image, and to display the imaging section which tracks the motion of the catheter when the traveling direction of the catheter is changed.

9. The magnetic resonance imaging system according to claim 8, wherein the RF detection coil is one in number.

10. The magnetic resonance imaging system according to claim 8, wherein the display unit is configured to display the movement state of the tip of the catheter, together with time information indicative of elapse during detecting the positional information.

11. A method of magnetic resonance imaging for interventional MRI involving an operator's operation to insert a catheter into an object, the catheter having a tip and being inserted into the object from the tip thereof, comprising steps of:
- magnetically scanning a region of the object to acquire image data of the region;
- detecting positional information indicative of a position of the tip of the catheter within the object;
- automatically tracking an imaging section which changes according to a motion of the catheter when a traveling direction of the catheter is changed; and
- displaying both of an image based on the acquired image data of the region and, together with the image, a movement state of the tip of the catheter based on the detected positional information;
- wherein the display step displays, in a superimposition manner, the positional information of the position of the tip on the image serving as a reference image, and displays the imaging section which tracks the motion of the catheter when the traveling direction of the catheter is changed.

12. The method according to claim 11, wherein the display step displays the movement state of the tip of the catheter, together with time information indicative of elapse during detecting the positional information.

13. A method of magnetic resonance imaging for interventional MRI involving an operator's operation to insert a catheter into an object, the catheter having a tip and being inserted into the object from the tip thereof, comprising steps of:
- magnetically scanning a region of the object to acquire image data of the region;
- acquiring, together with application of a gradient magnetic field to an RF detection coil attached to the tip of the catheter, an MR signal from a vicinity of the RF detection coil excited by an RF magnetic field;
- obtaining positional information indicative of a position of the RF detection coil as the position of the tip of the catheter through a frequency analysis of the MR signal;
- automatically tracking an imaging section which changes according to a motion of the catheter when a traveling direction of the catheter is changed; and
- displaying both of an image based on the acquired image data of the region and, together with the image, a movement state of the tip of the catheter based on the detected positional information;
- wherein the displaying step displays, in a superimposition manner, the positional information of the position of the tip on the image serving as a reference image, and displays the imaging section which tracks the motion of the catheter when the traveling direction of the catheter is changed.

14. The method according to claim 13, wherein the RF detection coil is one in number.

15. The method according to claim 13, wherein the display step displays the movement state of the tip of the catheter, together with time information indicative of elapse during detecting the positional information.

* * * * *